United States Patent
Nanba

(10) Patent No.: US 7,699,939 B2
(45) Date of Patent: Apr. 20, 2010

(54) SUBSTRATE CLEANING METHOD

(75) Inventor: Hiromitsu Nanba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 500 days.

(21) Appl. No.: 11/641,038

(22) Filed: Dec. 19, 2006

(65) Prior Publication Data

US 2007/0137677 A1 Jun. 21, 2007

(30) Foreign Application Priority Data

Dec. 19, 2005 (JP) ............................. 2005-364966

(51) Int. Cl.
 *B08B 1/02* (2006.01)
 *B08B 3/00* (2006.01)
 *B08B 7/04* (2006.01)
(52) U.S. Cl. ............................. 134/33; 134/30; 134/34; 134/37
(58) Field of Classification Search .................. 134/33, 134/31, 30, 34, 37
See application file for complete search history.

(56) References Cited

U.S. PATENT DOCUMENTS

2005/0026455 A1* 2/2005 Hamada et al. ............. 438/782
2006/0042666 A1* 3/2006 Tsujimura ................... 134/95.2
2007/0131256 A1* 6/2007 Nanba et al. ................. 134/33

FOREIGN PATENT DOCUMENTS

| EP | 0825279 | * | 2/1998 |
| JP | 2001-53051 | | 2/2001 |
| JP | 2005-327936 | * | 11/2005 |
| WO | WO 2005/050724 | * | 6/2005 |
| WO | WO 2005/050724 | * | 12/2005 |

* cited by examiner

*Primary Examiner*—Michael Kornakov
*Assistant Examiner*—Natasha Campbell
(74) *Attorney, Agent, or Firm*—Smith, Gambrell & Russell, LLP

(57) ABSTRACT

A substrate cleaning method including rotating a substrate at least for a period, supplying a liquid to the front surface of the substrate and cleaning the substrate, and drying the substrate is provided. Said drying of the substrate includes: reducing a rotational speed of the substrate to a first rotational speed lower than a rotational speed for cleaning the substrate; starting to move a liquid supply position from approximately the center of the substrate towards a peripheral portion when the rotational speed of the substrate is reduced down to the first rotational speed; stopping liquid supply when the second rotational speed lower than the first rotational speed is reached; increasing the rotational speed from the second rotational speed; and supplying a gas towards the substrate while rotating the substrate at a higher rotational speed than the second rotational speed.

16 Claims, 8 Drawing Sheets

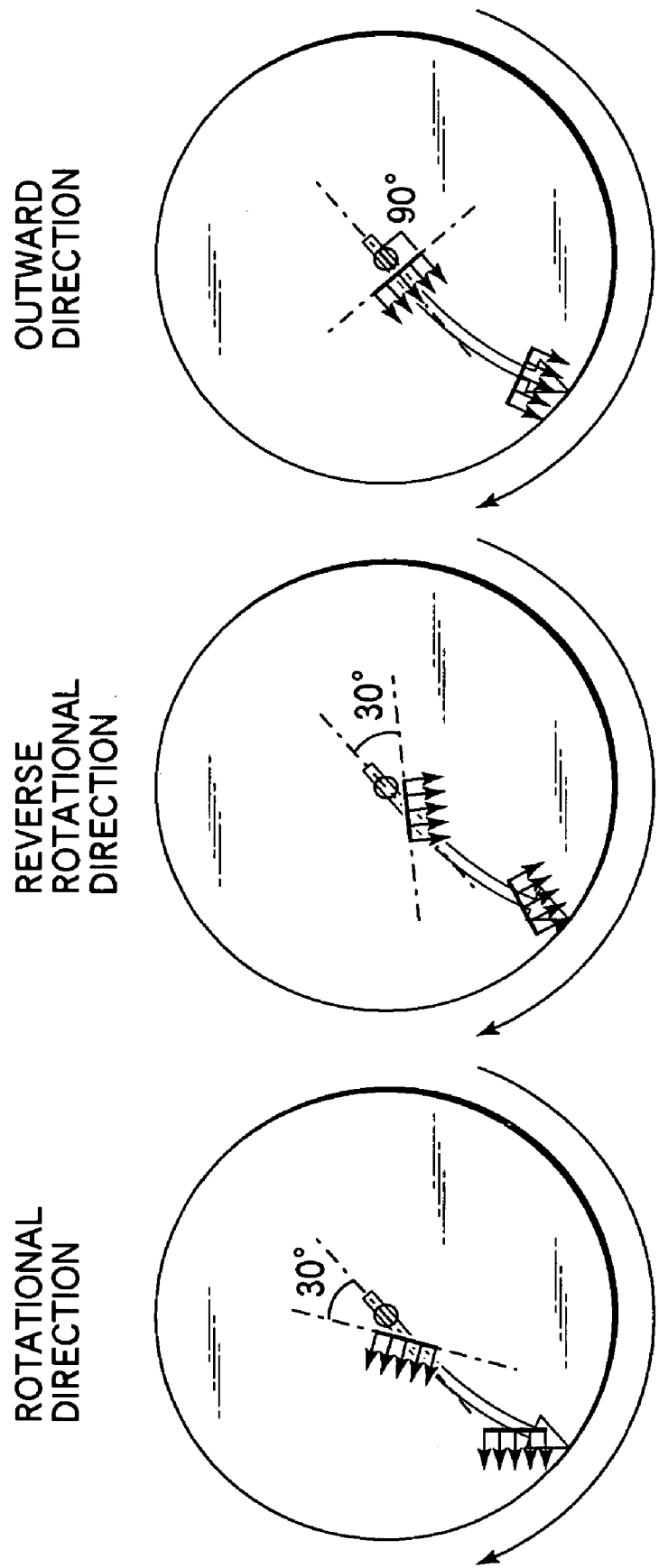

SUBSTRATE CLEANING METHOD

BACKGROUND OF THE INVENTION

1. Field of the Invention

The present invention relates to a substrate cleaning method and a substrate cleaning apparatus, which are used to clean semiconductor wafers, substrates for flat panel displays (FPDs) such as glass substrates for liquid crystal displays (LCDs), and substrates for other devices.

2. Description of the Related Art

In a semiconductor device manufacturing process, a semiconductor wafer (hereafter, simply referred to as wafer) is cleaned using a predetermined chemical (cleaning liquid), and a cleaning process of removing a polymer and the like after contamination and etching processes of particles, organic contaminants, metal impurities and the like adhered to the wafer is then carried out.

A sheet-fed wafer cleaning apparatus that carries out a chemical process by holding the wafer on a spin chuck, supplying a chemical onto the front and back surfaces of the wafer either at rest or spinning, supplies a rinsing liquid such as purified water onto the wafer while spinning the wafer at a predetermined rotational rate so as to wash away the chemical, and then carry out a drying process while spinning the wafer is known as such wafer cleaning apparatus for carrying out that cleaning process.

As such a sheet-fed wafer cleaning apparatus, in the case of cleaning using a hydrofluoric acid chemical, for example, the rinsing liquid in the periphery of the wafer may be shaken off in a short period by centrifugal force since the wafer front surface is hydrophobic; however, the timing of shaking off the rinsing liquid at the wafer center where the centrifugal force is small is delayed, and thus watermarks may generate in the wafer periphery that has already dried while shaking off the rinsing liquid at the center. In addition, liquid drops may remain at the wafer center, causing particle generation.

In order to resolve such disadvantages, a technology scanning from the substrate center out towards the peripheral portion using a nozzle that sprays purified water and a nozzle that sprays inert gas is disclosed in Japanese Patent Application Laid-open No. 2001-53051. Such configuration allows nearly simultaneous progression of wetting the substrate with sprayed purified water, removing a purified water film using sprayed inert gas, and removing a water film from the substrate by rotational centrifugal force, and since it dries from the substrate center out towards the periphery spreading out in an approximate concentric circle, watermarks and contamination are prevented.

However, with such technology, since the wafer or substrate is basically spun at a high speed when drying, rinsing liquid may rebound from a chamber or the like of the apparatus at this time, and water drops may adhere to dried parts of the wafer, leading to particles and the like.

Furthermore, while there are various product wafers such as ones with patterns formed thereon or various films formed thereon, and a cleaning process in which generation of particles on various wafers having such hydrophobic parts is sufficiently suppressed is desired, however, adequate results are not yet necessarily achieved so far.

BRIEF SUMMARY OF THE INVENTION

The present invention aims to provide a substrate cleaning method and a substrate cleaning apparatus, which make it difficult for particles to remain on the front surfaces of substrates having a hydrophobic part on the front surface.

The present invention also aims to provide a computer readable storage media to be stored with a control program to implement such method.

In order to resolve the above-given problems, according to a first aspect of the present invention, a substrate cleaning method including: rotating a substrate at least for a period, supplying a liquid to the front surface of the substrate and cleaning the substrate, and drying the substrate, is provided. Said drying of the substrate includes: reducing a rotational speed of the substrate to a first rotational speed lower than a rotational speed for cleaning the substrate; starting to move a liquid supply position from approximately the center of the substrate towards a peripheral portion when the rotational speed of the substrate is reduced down to the first rotational speed; stopping liquid supply when the second rotational speed lower than the first rotational speed is reached; increasing the rotational speed from the second rotational speed; and supplying a gas towards the substrate while rotating the substrate at a higher rotational speed than the second rotational speed.

According to the above-given first aspect, the liquid is preferably supplied to approximately the central area of the substrate when reducing the speed to the first rotational speed. Furthermore, the liquid supply position may be at the peripheral portion of the substrate when the rotational speed of the substrate is the second rotational speed. Moreover, the supplied amount of liquid may be reduced as the liquid supply position moves from approximately the center of the substrate to the peripheral portion while moving the liquid supply position from approximately the center of the substrate to the peripheral portion.

When supplying the gas to the substrate, the gas may be supplied while moving the liquid supply position from approximately the center of the substrate to the peripheral portion. In this case, the rotational speed of the substrate for supplying the gas while moving the liquid supply position from approximately the center of the substrate to the peripheral portion is preferably lower than rotational speed of the substrate for cleaning. Furthermore, cleaning the substrate may include supplying a chemical to the front surface of the substrate and chemical cleaning, and supplying a rinsing liquid to that front surface and rinsing while rotating the substrate after cleaning. Moreover, the liquid supplied to the substrate while moving the supply position from approximately the center of the substrate to the peripheral portion may be a rinsing liquid.

The first rotational speed may be 500 rpm or less, preferably the first rotational speed is 30 to 100 rpm, the second rotational speed is 10 to 30 rpm, and the rotational speed of the substrate for supplying the gas is 60 to 500 rpm. Furthermore, it may be configured so that the rotational speed of the substrate linearly decreases from the first rotational speed until reaching the second rotational speed, the rotational speed of the substrate linearly continues to increase from the second rotational speed until gas supply is started, and the gas is supplied to the substrate while maintaining rotation of the substrate at that rotational speed. Moreover, it is preferable to supply the gas using a nozzle having a slit discharge outlet, and in this case, the nozzle is preferably provided so as to discharge the gas radially towards outer sides of the substrate.

The above-given configuration is particularly effective for the front surface of a substrate including a hydrophobic area, and typically, it is effective for a substrate including a hydrophobic area, which is provided using a hydrofluoric acid chemical as the chemical. Furthermore, the gas may be an inert gas.

According to a second aspect of the present invention, a substrate cleaning apparatus configured to clean the front surface of a substrate is provided. This substrate cleaning apparatus includes: a substrate holding unit, which holds the substrate horizontally capable of turning the substrate; a rotating mechanism, which rotates the substrate holding unit; a liquid supplying mechanism configured to supply a chemical to the front surface of the substrate and clean the substrate; a cleaning mechanism configured to supply a liquid to the front surface of the substrate via a liquid nozzle and clean the substrate; a gas supplying mechanism configured to supply a gas to the front surface of the substrate via a gas nozzle; and a controlling mechanism configured to control the rotating mechanism, the cleaning mechanism, and the gas supplying mechanism so as to rotate the substrate at least for a period, supply a liquid to the front surface of the substrate and clean the substrate, and dry the substrate while rotating the substrate. For drying, the controlling mechanism controls the rotational speed of the substrate to go down to a first rotational speed lower than rotational speed for cleaning the substrate, controls a liquid supply position to start to move from approximately the center of the substrate to the peripheral portion when the rotational speed of the substrate is reduced to the first rotational speed, controls liquid supply to stop when the second rotational speed lower than the first rotational speed has been reached, controls the rotational speed to increase from the second rotational speed, and controls supply of a gas to the substrate while rotating the substrate at a higher rotational speed than the second rotational speed.

According to the above-given second aspect, the cleaning mechanism includes: a chemical supplying mechanism, which has a chemical nozzle configured to supply a chemical to the front surface of the substrate; and a rinsing liquid supplying mechanism, which has a rinsing liquid nozzle configured to supply a rinsing liquid to the front surface of the substrate; and the controlling mechanism may control so as to supply the chemical to the front surface of the substrate from the chemical nozzle and clean the substrate, supply the rinsing liquid to the front surface of the substrate from the rinsing liquid nozzle, and rinse the substrate after cleaning.

According to a third aspect of the present invention, a control program to be executed by a computer is provided. The control program causes the computer to control a substrate cleaning apparatus implementing the above-mentioned method.

According to the third aspect of the present invention, the computer readable storage media in which a control program to be executed by a computer is stored is provided. This control program represents a substrate cleaning method including supplying a liquid to the front surface of a substrate and cleaning the substrate while rotating a substrate at least for a period, and drying the substrate; for drying, a computer controls the substrate cleaning apparatus to decrease the rotational speed of the substrate to a first rotational speed lower than rotational speed for cleaning the substrate, controls a liquid supply position to start to move from approximately the center of the substrate to the peripheral portion when the rotational speed of the substrate is reduced to the first rotational speed, controls liquid supply to stop when the second rotational speed lower than the first rotational speed has been reached, controls the rotational speed to increase from the second rotational speed, and controls supply of a gas to the substrate while rotating the substrate at a higher rotational speed than the second rotational speed.

According to the present invention, the front surface of the substrate is chemically cleaned and rinsed, and a rinsing liquid is supplied to the substrate while scanning a nozzle, which supplies the rinsing liquid from the central area of the substrate towards the peripheral portion while rotating the substrate at a low speed. This allows an inner area and an outer area of the substrate to dry uniformly even if the substrate has a hydrophobic front surface. Furthermore, this allows reduction of the chance for contamination of dried areas due to rebounding of the rinsing liquid. Moreover, since an inert gas is then supplied to the substrate while scanning a nozzle, which supplies an inert gas while maintaining a low rotational speed of the wafer, from the central area of the substrate towards the peripheral portion, water remaining in a pattern of the substrate or other related parts may be dried quickly. As a result, a cleaning process for various substrates having hydrophobic areas on respective front surfaces, particularly substrates having a hydrophilic pattern on respective hydrophobic front surfaces may be implemented with particles being difficult to remain on the respective front surfaces.

BRIEF DESCRIPTION OF THE SEVERAL VIEWS OF THE DRAWINGS

FIGS. 10A through 10C are diagrams describing $N_2$ gas discharge directions from a slit discharge outlet of the $N_2$ gas discharge nozzle.

DETAILED DESCRIPTION OF THE INVENTION

An embodiment of the present invention is described in detail forthwith while referencing the appended drawings. A case of applying the present invention to a wafer cleaning apparatus capable of cleaning the front and back surfaces of a wafer simultaneously is described now.

Figure 1:
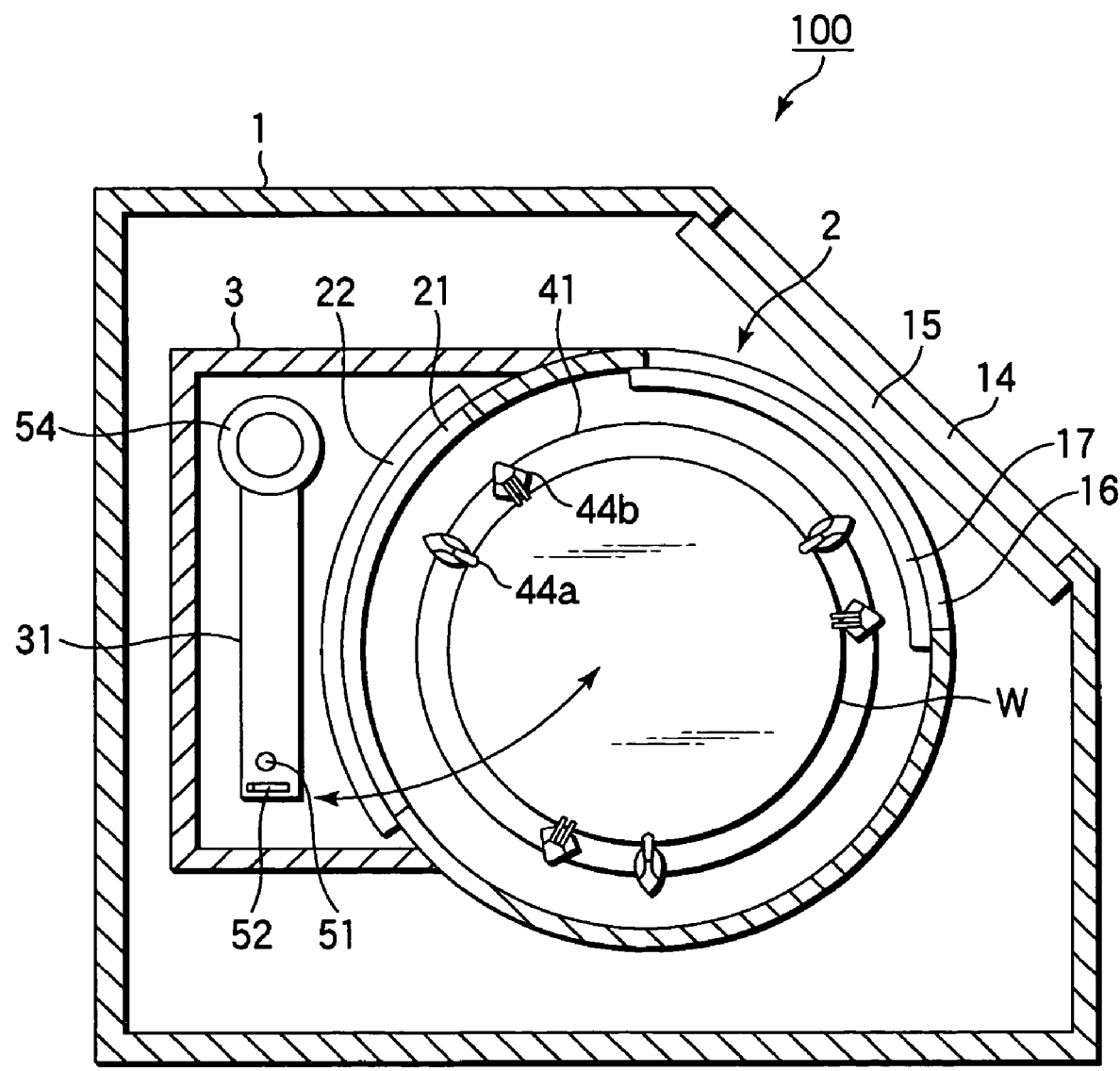
FIG. 1 is a top view schematically showing an exemplary wafer cleaning apparatus used for implementing a method according to an embodiment of the present invention.
Figure 2:
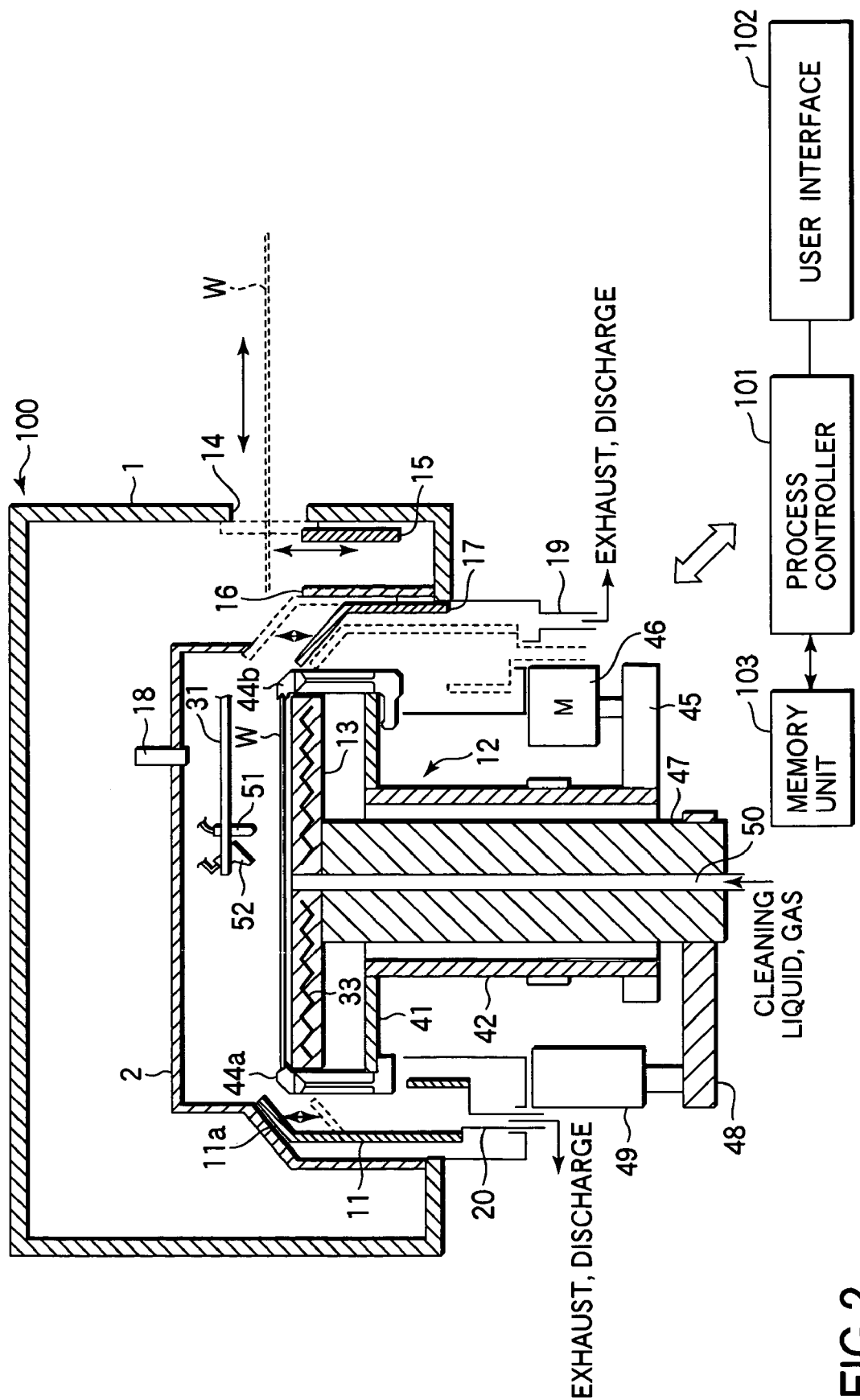
FIG. 2 is a cross section schematically showing the wafer cleaning apparatus of FIG. 1.

FIG. 1 is a top view schematically showing an exemplary wafer cleaning apparatus used for implementing a method according to the embodiment of the present invention, and FIG. 2 is a schematic cross section thereof. A wafer cleaning apparatus 100 has a housing 1, which includes an outer chamber 2 configured to house a wafer for cleaning, and a nozzle arm storage unit 3 configured to store a first nozzle arm 31.

Furthermore, the wafer cleaning apparatus 100 includes an inner chamber 11 (FIG. 2), a spin chuck 12, which holds a wafer W in the inner chamber 11, and an under plate 13, which is provided capable of up and down movements and facing the back surface of the wafer W held by the spin chuck 12.

The housing 1 is formed with a window 14 used as an inlet and outlet for wafers, which is opened and closed by a first shutter 15. The window 14 is open at times of carrying the wafer W in or out, and is kept blocked by the first shutter 15 at other times. The first shutter 15 is made to open and close the window 14 from inside of the housing 1, and prevent atmosphere leakage from within the housing 1 effectively even when the inside has a positive pressure.

A window 16 or wafer W inlet/outlet is positioned corresponding to the above-mentioned window 14 at the side of the outer chamber 2, and is opened and closed by a second shutter 17. The window 16 is open at times of carrying the wafer W in or out, and is kept blocked by the second shutter 17 at other times. The cleaning process for the wafer W is carried out within the outer chamber 2, where when carrying in/out the wafer W, both of the windows 14 and 16 are open, and a transfer arm, not shown in the drawing, is inserted into the outer chamber 2 from the outside to receive or hand over the wafer W to the spin chuck 12.

The second shutter 17 is also made to open and close the window 16 from inside of the outer chamber 2, and prevent atmosphere leakage from the outer chamber 2 effectively even when the inside has a positive pressure.

A gas inlet 18 for introducing an inert gas such as $N_2$ gas into the outer chamber 2 is provided on the upper wall of the outer chamber 2. This gas inlet 18 creates a down flow through the outer chamber 2 and prevents vapor of a chemical discharged to the wafer W held by the spin chuck 12 from filling the outer chamber 2. Creation of such down flow results in watermarks being difficult to generate on the front surface of the wafer W. A drain 19 is provided at the bottom of the outer chamber 2, allowing exhaust and drainage from the drain 19.

The inner chamber 11 is used for preventing the chemical or purified water discharged to the wafer from scattering out to the surrounding area, and is provided surrounding the spin chuck 12 at the inner side of the outer chamber 2. This inner chamber 11 has a tapered part 11a at the top and a drain 20 at the bottom. Furthermore, the inner chamber 11 can be moved up and down between a processing position (indicated by a solid line in FIG. 2) at which the tapered part surrounds the wafer W and which the upper end of the inner cup is higher than the wafer W held by the spin chuck 12, and a retraction position (indicated by a dotted line in FIG. 2) at which the upper end of the inner cup is lower than the wafer W held by the spin chuck 12.

The inner chamber 11 is maintained at the retraction position so as not to interrupt a transfer arm (not shown in the drawing) from entering/withdrawing at the time of carrying in/out the wafer W. Meanwhile, it is maintained at the processing position when cleaning the wafer W held by the spin chuck 12. In addition, the chemical used for cleaning the wafer W is lead to the drain 20. A chemical collecting line and an exhaust duct, not shown in the drawing, are connected to the drain 20, thereby preventing mist and the like generated within the inner chamber 11 from scattering within the outer chamber 2.

The spin chuck 12 has a rotary plate 41 and a rotary tube 42 connected to the central region of the rotary plate 41 and extending therebelow, and a supporting pin 44a supporting the wafer W and a holding pin 44b holding the wafer W are attached to the peripheral portion of the rotary plate 41. Transfer of the wafer W between the transfer arm (not shown in the drawing) and the spin chuck 12 is carried out using this supporting pin 44a. The supporting pin 44a is preferably provided in at least three places in terms of securely supporting the wafer W. The holding pin 44b can be tilted so as for the upper tip of the holding pin 44b to move towards the outer side of the rotary plate 41. This is possible by a pressure mechanism, not shown in the drawing, pressing a portion of the holding pin 44b at a lower end of the rotary plate 41 against the rotary plate 41 so as not to prohibit transfer of the wafer W between the transfer arm (not shown in the drawing) and the spin chuck 12. The holding pin 44b is also preferably provided in at least three places in terms of securely holding the wafer W.

A belt 45 is wrapped around the lower end outer surface of the rotary tube 42, and thus driving the belt 45 with a motor 46 rotates the rotary tube 42 and the rotary plate 41, resulting in rotation of the wafer W held by the holding pin 44b.

The under plate 13 is connected to a shaft (supportive column) 47 inserted through the central region of the rotary plate 41 and the rotary tube 42. The lower end of the shaft 47 is fixed to a horizontal plate 48, and this horizontal plate 48 along with the lower end of the shaft 47 can be moved up and down by an elevating mechanism 49 such as an air cylinder. Then, the under plate 13 is lowered by this elevating mechanism 49 down to a position near the rotary plate 41 so as not to collide with the transfer arm when transferring the wafer W between the spin chuck 12 and the transfer arm (not shown in the drawing), and is raised to a position near the back surface of the wafer W when cleaning the back surface of the wafer W. Furthermore, it is lowered to an appropriate position after the back surface cleaning process is completed. Note that the highest position of the under plate 13 is fixed, and the relative position of the wafer W held by the spin chuck 12 to the under plate 13 may be adjusted by raising and/or lowering the rotary tube 42.

A back surface cleaning nozzle 50 configured to supply a chemical or cleaning liquid, purified water or rinsing liquid, and nitrogen gas onto the back surface of the wafer W is provided to the under plate 13 and the shaft 47 penetrating through the interior thereof. Furthermore, the under plate 13 has a heater 33 embedded therein, controlling the temperature of the wafer W via the under plate 13 by supplying power from a power source not shown in the drawing.

A window 21 is formed in a part of the nozzle arm storage unit 3 adjacent to the outer chamber 2 and is opened and closed by a third shutter 22. The third shutter 22 is closed to separate the atmosphere in the nozzle arm storage unit 3 from that in the outer chamber 2.

Figure 3:
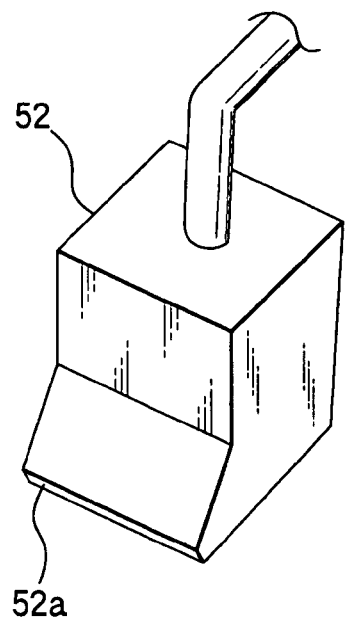
FIG. 3 is an oblique perspective showing a schematic structure of a $N_2$ gas discharge nozzle utilized by the wafer cleaning apparatus of FIG. 1.

The nozzle arm 31, which is stored in the nozzle arm storage unit 3, is capable of turning and moving up and down between the nozzle arm storage unit 3 and the highest position of the wafer W center under the control of a driving mechanism 54 provided at an end of the nozzle arm 31, and a liquid discharge nozzle 51 configured to discharge a chemical such as an HF chemical as a cleaning liquid and purified water as a rinsing liquid is provided at the front end thereof. Furthermore, as shown in FIG. 3, a $N_2$ gas discharge nozzle 52 having a slit discharge outlet 52a, which discharges $N_2$ gas which is an inert gas, is provided. This $N_2$ gas discharge nozzle 52 may adjust its angle relative to the horizontal plane.

Figure 4:
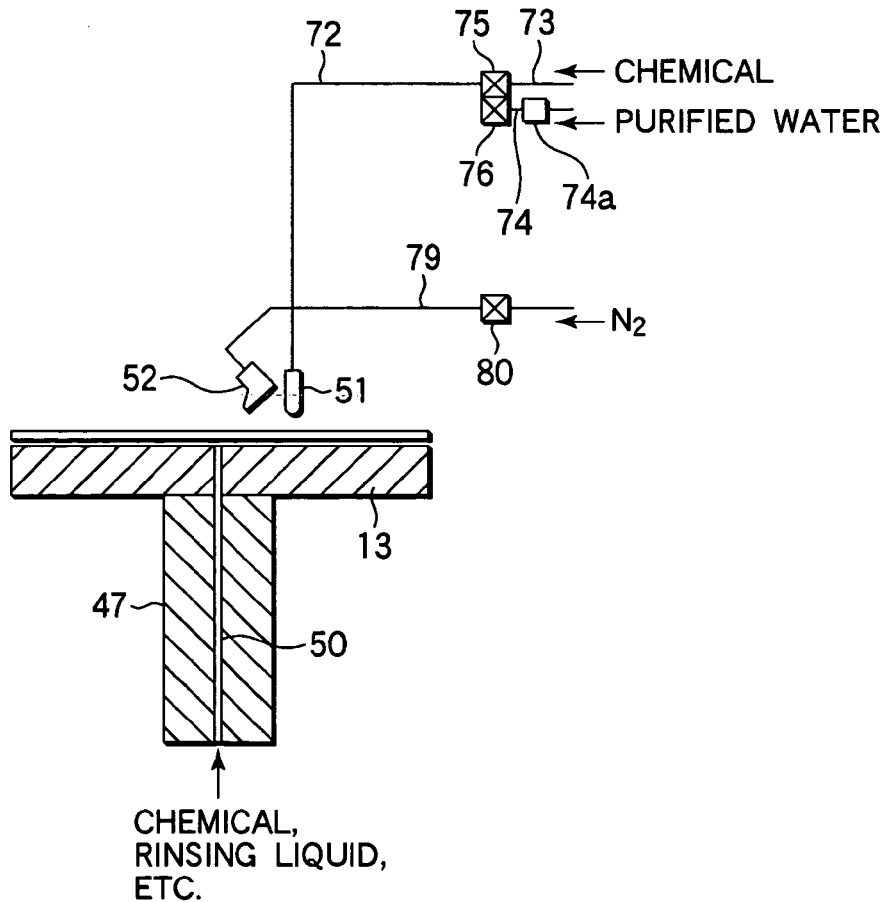
FIG. 4 is a diagram showing a liquid and gas supply system of the wafer cleaning apparatus of FIG. 1.

FIG. 4 is a diagram schematically showing a liquid supply system in the wafer cleaning apparatus 100. As shown in FIG. 4, a liquid supply line 72 is connected to the liquid discharge nozzle 51 provided on the front surface side of the wafer. A chemical supply line 73 and a purified water supply line 74 are connected to the liquid supply line 72 via valves 75 and 76, respectively, allowing supply of a chemical as a cleaning liquid and purified water as a rinsing liquid to the front surface of the wafer W. Furthermore, a flow rate controller 74a is provided to the purified water supply line 74, capable of controlling the flow rate of purified water as the rinsing liquid.

Moreover, a $N_2$ supply line 79 is connected to the $N_2$ gas discharge nozzle 52, and a valve 80 is provided to the line 79.

Each of components of the cleaning apparatus 100 is connected to and controlled by a process controller 101 including a CPU, as shown in FIG. 2. A user interface 102, which includes a keyboard used by a process manager to input commands for managing each of components of the wafer cleaning apparatus 100, a display configured to make visible and display operational statuses of the respective components of the wafer cleaning apparatus 100, and related units, and a memory unit 103, which is configured to store recipes including a control program and data specifying processing conditions for implementing various processes to be executed by the wafer cleaning apparatus 100 under control of the process controller 101, are connected to the process controller 101.

As needed, an instruction or the like is received from the user interface 102, an arbitrary recipe is read out from the memory unit 103 and then executed by the process controller 101, thereby allowing the wafer cleaning apparatus 100 to execute various desired processes. A recipe may be stored in a readable storage media such as a CD-ROM, hard disk, flexible disk, nonvolatile memory, for example, or it may be transmitted as needed from an appropriate device via a dedicated circuit or the like and used online.

Next, the cleaning process for the wafer cleaning apparatus configured in the above manner is described. To begin with, the first shutter 15 provided to the housing 1 and the second shutter 17 provided to the outer chamber 2 are opened, the inner chamber 11 is kept at the retraction position, the under plate 13 is kept waiting at a position near to the rotary plate 41, and the nozzle arm 31 is stored in the nozzle arm storage unit 3.

Figure 5:
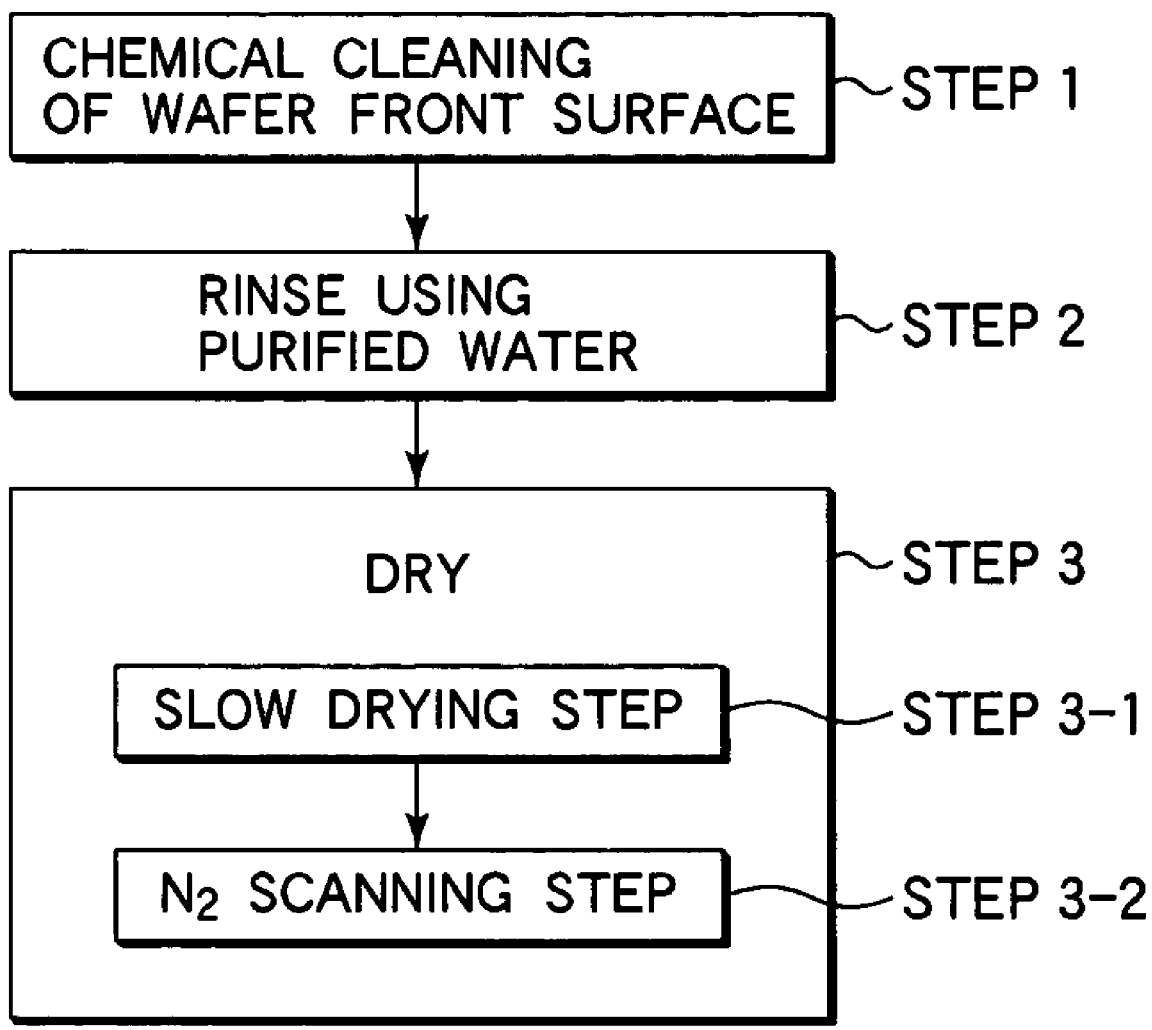
FIG. 5 is a flowchart describing an exemplary sequence of a wafer front surface cleaning process by the wafer cleaning apparatus of FIG. 1.
Figure 6A:
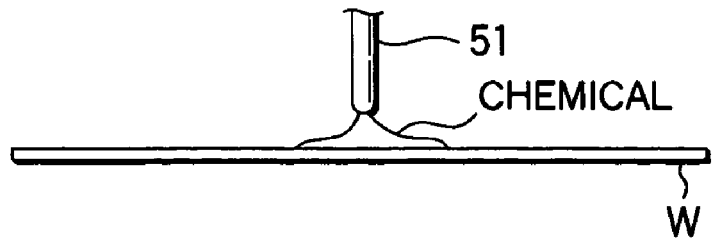
FIGS. 6A through 6D are schematics describing each step of FIG. 5.

In this state, the wafer W is carried in to clean the front and back surfaces thereof simultaneously. Cleaning of the front surface of the wafer W is described first. FIG. 5 is a flowchart showing an exemplary procedure of the cleaning process for the wafer W front surface, and FIGS. 6A through 6D are schematics describing each of the steps in FIG. 5. To begin with, as shown in FIG. 6A, the liquid discharge nozzle arm 31 enters the outer chamber 2, the liquid discharge nozzle 51 is brought to a position above the center of the top surface of the wafer W, and an HF chemical, for example, is then supplied to the front surface of the wafer W via the chemical supply line 73, the liquid supply line 72, and the liquid discharge nozzle 51 to carry out the cleaning process (Step 1). At this time, proceeding of the cleaning process may be expedited by supplying a predetermined amount of the chemical onto the front surface of the wafer W and form a puddle (liquid film), or cleaning may be carried out while the chemical flows thereover. The wafer W may also be rotated at approximately 10 to 500 rpm from rest.

Figure 6B:
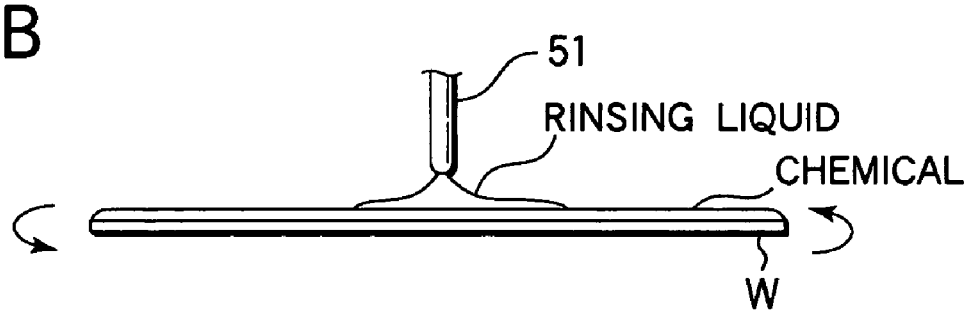

Next, as shown in FIG. 6B, the chemical supply line 73 is switched over to the purified water supply line 74, purified water is supplied as a rinsing liquid from the liquid discharge nozzle 51, and the rinsing process is carried out (Step 2). This rinses away the chemical from the front surface of the wafer W. The wafer rotational speed at this time is approximately 10 to 1500 rpm, preferably 500 to 1500 rpm.

A drying process is carried out thereafter (Step 3). This drying process is carried out by a slow drying step of drying the wafer W while supplying purified water as a rinsing liquid to the wafer W and scanning with a reduced wafer rotational speed less than that for the rinsing process (Step 3-1), and a $N_2$ scanning step of supplying $N_2$ gas to the wafer while scanning (Step 3-2).

Figure 6C:
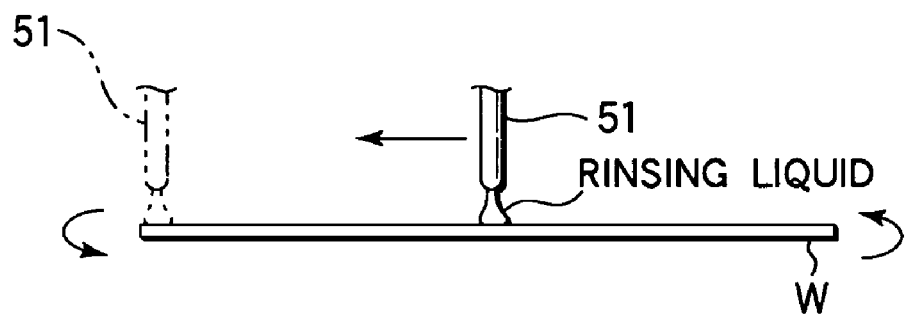

In the slow drying step (Step 3-1), the rotational speed of the wafer W is lowered from a low speed of 500 rpm to a lower speed, and when it becomes a first rotational speed, as shown in FIG. 6C, a rinsing liquid made of purified water is supplied onto the wafer W while the liquid discharge nozzle 51 scans from the center of the wafer W towards the peripheral portion. Supplying the rinsing liquid is then stopped when reaching a second rotational speed lower than the first rotational speed. The purified water supply position has reached the wafer peripheral portion by the time when the second rotational speed has been reached. Note that when scanning with purified water as the rinsing liquid in this manner, the amount of liquid on the wafer W may be reduced by controlling such that the supplied amount of purified water is reduced in stages or gradually as it progresses from the center of the wafer W to the peripheral portion.

Figure 6D:
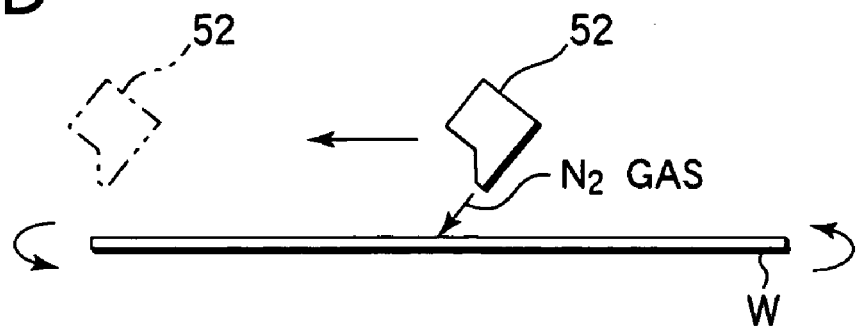

Afterwards, the rotational speed of the wafer is increased from the second rotational speed, and when reaching a predetermined rotational speed of 500 rpm or less, the $N_2$ scanning step (Step 3-2) starts. In this $N_2$ scanning step (Step 3-2), the rotational speed of the wafer is maintained at a predetermined speed of 500 rpm or less, and as shown in FIG. 6D, the $N_2$ gas discharge nozzle 52 is positioned first at the center of the wafer, and $N_2$ gas is then discharged onto the wafer W while scanning towards the peripheral portion.

Figure 7:
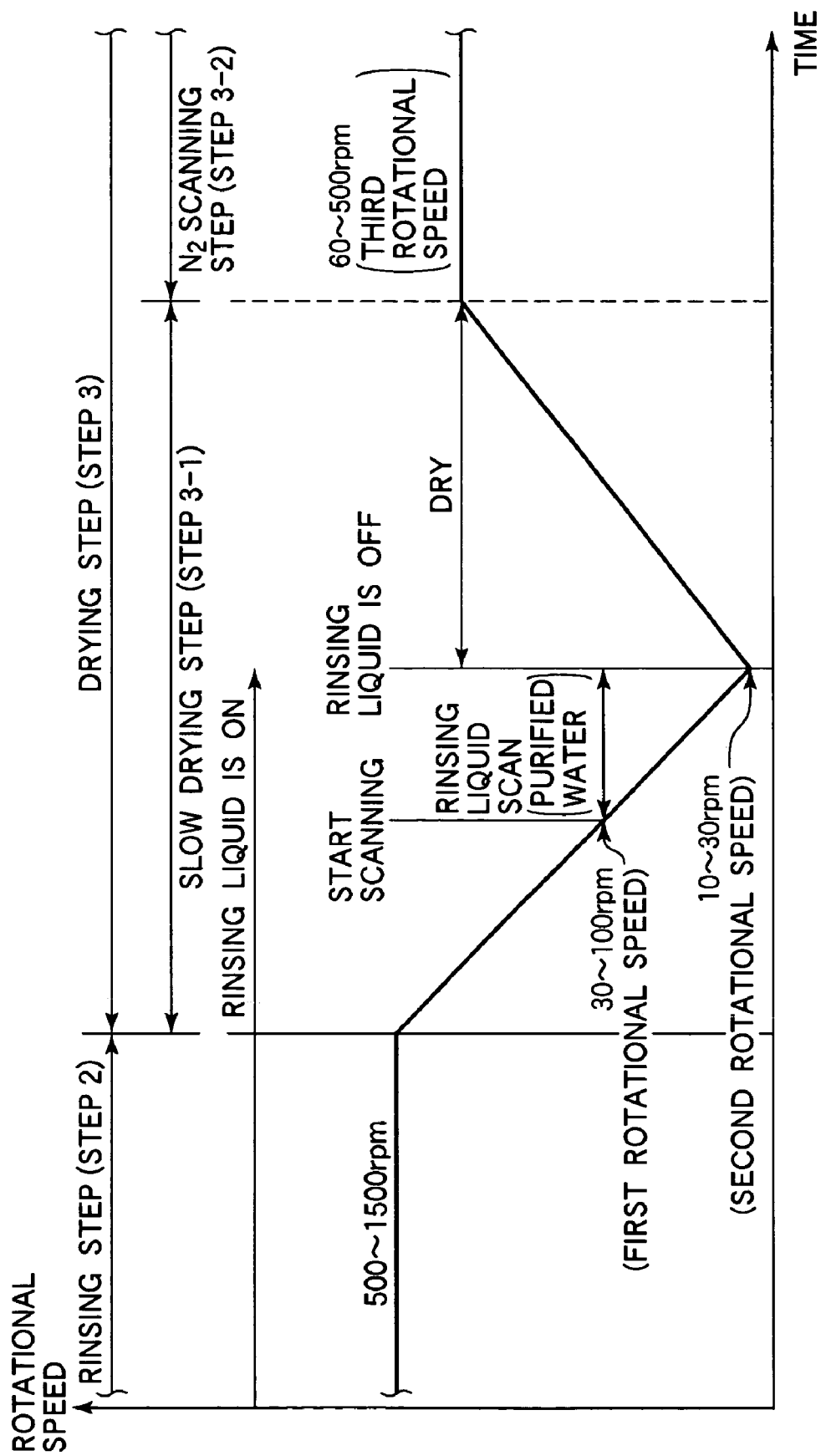
FIG. 7 is a timing chart describing a favorable example of the drying step of FIG. 5.

The drying step (Step 3) is preferably carried out in conformity with a recipe as shown in FIG. 7. FIG. 7 is a timing chart describing a favorable example of the drying step of Step 3. To begin with, the rinsing step of Step 2 is carried out with a wafer W rotational speed between 500 and 1500 rpm, and then Step 3-1 is carried out. In Step 3-1, the rotational speed of the wafer W is linearly reduced while purified water or rinsing liquid is supplied at nearly the center of the wafer W from the point when the rinsing step is completed, and at the time the rotational speed of the wafer W preferably reaches between 30 and 100 rpm (the first rotational speed), the liquid discharge nozzle 51 is made to scan towards the peripheral portion while continuing to discharge purified water as the rinsing liquid from the liquid discharge nozzle at the center of the wafer W. The rotational speed of the wafer W continues to decrease while the purified water is being discharged, and at the time the rotational speed of the wafer W reaches between 10 and 30 rpm (the second rotational speed), the liquid discharge nozzle 51 is made to reach the peripheral portion and discharge of purified water is stopped at that time. The duration of this scanning rinse is approximately 10 to 100 seconds. The rotational speed of the wafer W is then increased and further dried, and when it reaches a predetermined speed (the third rotational speed) between 60 and 500 rpm, $N_2$ scanning in the above-mentioned Step 3-2 is started while maintaining that rotational speed. The wafer is then scanned from the center to the peripheral portion in a predetermined period, for example, approximately 30 to 80 seconds, water remaining on the front surface of the wafer W is moved to the outer side, and finally expelled from the wafer W. This concludes the wafer W drying step.

Such a drying step is carried out for the following reasons. When the front surface of the wafer W, which is made hydrophobic through cleaning using an HF chemical through high-speed rotation as in the conventional manner, is shaken off and dried, outward areas of a wafer W on which a great centrifugal force is imposed dries early. Purified water used as the rinsing liquid, however, still remains in the central area on which a small centrifugal force is imposed, and when the purified water in the central area reaches the dried outward areas and then dries there, particles remain therein. Furthermore, if purified water remaining in the central area dries, particles are left as expected. Moreover, particles also generate, emanating from the fact that mist that has bombarded and rebounded from a chamber wall and other related parts then adhered to the wafer W due to the high-speed rotation. On the contrary, by rotating the wafer W at a low speed and supplying purified water as the rinsing liquid while scanning from the center towards the peripheral portion as in the above-mentioned embodiment, purified water on the wafer is expelled to the outside while preventing local drying, and by stopping supply of the rinsing liquid and rotating the wafer W at a low speed thereafter, mist does not rebound, allowing it to dry uniformly. The reason why scanning with the rinsing liquid is started when the rotational speed of the wafer W reaches the first rotational speed lower than that for rinsing is because the rotational speed for rinsing causes the rinsing liquid to scatter. However, if scanning starts with the second rotational speed, the centrifugal force is too weak for the central area of the wafer W to dry. Furthermore, the reason why the scanning ends at a speed slower than the second rotational speed is because mist would re-adhere to the wafer W due to rebounding at the wafer edge and rebound at the chuck holding the wafer W or other related parts if the rotational speed of the wafer W at the time when the liquid supply nozzle reaches close to the wafer peripheral portion were the first rotational speed for scanning initially.

In the case of the wafer W being a bare wafer without a pattern formed thereon, the front surface of the wafer W may be sufficiently dried by the end of this Step 3-1. However, in the case of a wafer with a pattern, hydrophobic areas and hydrophilic areas are mixed, resulting in difficulty in drying the purified water remaining in the inner parts of the pattern in only the above-given Step 3-1. Therefore, processing in Step 3-2 is carried out. In this Step 3-2, $N_2$ gas is supplied at a relatively slow wafer W rotational speed as described above. Moreover, by scanning $N_2$ gas from the center of the wafer W towards the peripheral portion, the purified water remaining on the wafer W may be forced to move towards the outer side of the wafer W, and the front surface of the wafer W may be almost completely dried. At this time, since the rotational speed of the wafer W is relatively slow, moisture adhered to the chuck or other related parts turning into mist, adhering to the wafer W, and then generating particles is prevented.

Figure 8:
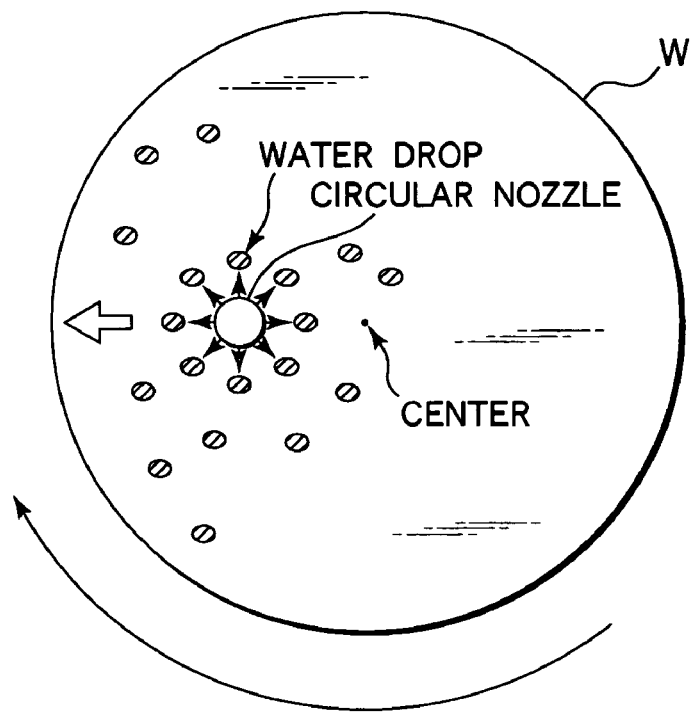
FIG. 8 is a schematic describing a $N_2$ gas scan state in the case of using a circular nozzle as a $N_2$ gas discharge nozzle.
Figure 9:
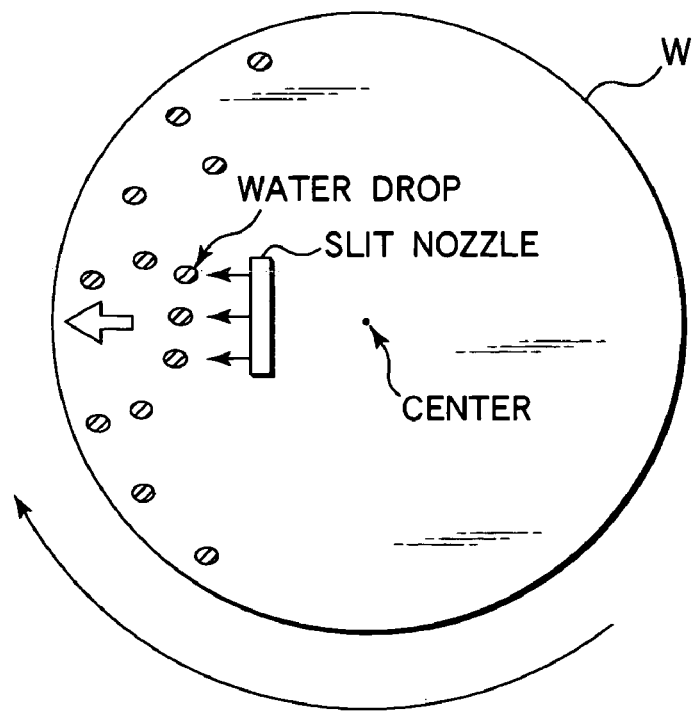
FIG. 9 is a schematic describing a $N_2$ gas scan state in the case of using a slit nozzle as a $N_2$ gas discharge nozzle.

Furthermore, provision of the slit discharge outlet 52a to the $N_2$ gas discharge nozzle 52 attains the following advantages. Namely, in the case of using a typical circular nozzle, as shown in FIG. 8, when the nozzle is scanned from the center of the wafer W towards the peripheral portion, remaining purified water on the front surface of the wafer W turns into water drops due to $N_2$ gas from the nozzle and scatters in all directions, and the water drops scattered to the central area of the front surface of the wafer W remain and become particles. On the contrary, use of a slit nozzle having a slit discharge outlet provides good direction controllability, ensuring the purified water to scatter towards the outer side, as shown in FIG. 9. Furthermore, this provides a wider discharge area than when using a circular nozzle, and increase in the $N_2$ gas speed. Therefore, the wafer may be dried with a smaller rotational speed, increasing drying efficiency. Note that such scanning is not always required when supplying $N_2$ gas, and a fixed result may be achieved even in such as case.

Furthermore, three directions of $N_2$ gas discharge from the slit discharge outlet 52a may be considered: rotational direction of the wafer W as shown in FIG. 10A, reverse rotational direction as shown in FIG. 10B, and outward direction as shown in FIG. 10C; of all, the outward direction of FIG. 10C has the highest drying efficiency. This is because the scattering force for the water drops is greatest at the peripheral portion of the wafer W.

When conducting a drying experiment for a wafer W on which a thermally-oxidized film is formed, it is found that use of the circular nozzle could not dry it sufficiently even at 300 rpm and that a rotational speed of 400 rpm or greater is necessary in order to sufficiently dry. On the contrary, it is found that use of the slit nozzle allows the wafer to dry at 300 rpm sufficiently, and that particularly in the case of discharging in the outward direction of FIG. 10C, drying is possible at 60 rpm. In this manner, advantages of using the slit nozzle have been confirmed.

Meanwhile, during the cleaning process of the front surface of the wafer W in this manner, the back surface of the wafer W is also cleaned. First, the gap between the wafer W and the under plate 13 is set to 4 mm or greater, for example, 10 mm or greater so the under plate 13 does not interrupt the wafer from entering. The under plate 13 is then raised to a position near the back surface of the wafer W held by the spin chuck 12, setting the gap between the wafer W and the under plate 13 between 0.5 and 3 mm, for example, 0.8 mm.

Next, during the above-given Step 1, a predetermined chemical is supplied as a cleaning liquid in the gap between the wafer W and the under plate 13 via the back surface cleaning nozzle 50, and the cleaning process is then carried out.

Once the cleaning process using the chemical is completed, purified water is supplied as a rinsing liquid between the wafer W back surface and the under plate 13 via the back surface cleaning nozzle 50 in the beginning of the above-given Step 2. Next, the under plate is lowered, but in order to prevent a vacuum from occurring between the wafer W and the under plate 13 and the wafer W from bending or breaking, it is preferable to first supply $N_2$ gas therebetween via the back surface cleaning nozzle 50 to destroy the liquid film formed therebetween. The gap between the wafer W and the under plate 13 is widened to 1.5 to 4 mm, for example, 1.5 mm by lowering the under plate 13, purified water is supplied therebetween as a rinsing liquid, and a rinsing process is then carried out. Such series of processing until this rinsing process corresponds to the rinsing step of the above-mentioned Step 2.

Afterwards, purified water supply is stopped, the under plate 13 is further lowered, the gap between the wafer W and the under plate 13 is set to 4 mm or greater, for example, 10 mm, and is shaken off and dried in the above-given Step 3. At this time, $N_2$ gas may be supplied to promote drying, as when cleaning the front surface.

Once cleaning the front and back surfaces of the wafer W in this manner is completed, the transfer arm not shown in the drawing is inserted below the wafer W while the gap between the wafer W and the under plate 13 is maintained at 4 mm or greater, for example, 10 mm, to hand over the wafer W to the transfer arm.

Note that the present invention is not limited to the above-given embodiment, and various modifications are possible within the scope of the present invention. For example, with the above-given embodiment, an example where the present invention is applied to front surface cleaning when cleaning the front surface and the back surface of a wafer as a substrate simultaneously has been described; however, it may be applied to the case of only implementing front surface cleaning.

Furthermore, the present invention is particularly effective for a substrate having a hydrophobic area as in the above-mentioned embodiment; however, it is also applicable to a hydrophilic wafer.

Moreover, while N₂ gas, which is an inert gas, has been used as a gas to promote drying, another inert gas may also be used. It may also be another gas such as air as long as there are no adverse affects to the substrate front surface. In this case, the gas to be supplied is favorably a dry gas from which moisture has been removed. Furthermore, while the case of using a semiconductor wafer as a to-be-processed substrate has been given with the above-given embodiment, needless to say another substrate such as a substrate for a flat panel display (FPD) represented by a glass substrate for a liquid crystal display (LCD) is applicable.

The present invention is optimum for a cleaning process for various substrates having hydrophobic areas on the front surface such as substrates having a pattern and substrates having mixed hydrophobic areas and hydrophilic areas. Furthermore, the present invention provides advantages: one that a high particle suppression effect is provided even when the present invention is applied to hydrophilic substrates, and one that a particle suppression effect is provided regardless of the type of substrate.

What is claimed is:

1. A substrate cleaning method that comprises rotating a substrate at least for a period, performing liquid cleaning on a front surface of the substrate, and drying the substrate, wherein said performing liquid cleaning on the front surface of the substrate comprises supplying a treating liquid with a liquid supply position set at a central portion of the substrate while rotating the substrate at a reference rotational speed, and said drying the substrate comprises:

then, supplying the treating liquid with the liquid supply position kept at the central portion of the substrate and, at a first time point, starting a speed-reducing operation of reducing a rotational speed of the substrate from the reference rotational speed;

then, from the first time point, continuing the speed-reducing operation along with supply of the treating liquid and, at a second time point thereafter when the rotational speed of the substrate thereby reaches a first rotational speed lower than the reference rotational speed, starting a scanning operation of moving the liquid supply position from the central portion of the substrate towards a peripheral portion thereof while supplying the treating liquid;

then, from the second time point, further continuing the speed-reducing operation along with supply of the treating liquid and the scanning operation, and, at a third time point thereafter when the rotational speed of the substrate thereby reaches a second rotational speed lower than the first rotational speed, stopping supply of the treating liquid and ending the speed-reducing operation;

then, increasing the rotational speed of the substrate from the second rotational speed with supply of the treating liquid kept stopped from the third time point; and supplying a gas to the substrate while rotating the substrate at a higher rotational speed than the second rotational speed with supply of the treating liquid kept stopped from the third time point.

2. The method of claim 1, wherein the liquid supply position is at the peripheral portion of the substrate when the rotational speed of the substrate is the second rotational speed.

3. The method of claim 1, wherein the supplied amount of treating liquid is reduced as the liquid supply position moves from the central portion of the substrate to the peripheral portion thereof while moving the liquid supply position from the central portion of the substrate to the peripheral portion by the scanning operation.

4. The method of claim 1, wherein said supplying the gas to the substrate is performed while moving a gas supply position from a central portion of the substrate to a peripheral portion thereof.

5. The method of claim 4, wherein said supplying the gas to the substrate while moving the gas supply position is performed while rotating the substrate at a rotational speed lower than the reference rotational speed.

6. The method of claim 1, wherein said performing liquid cleaning on the front surface of the substrate comprises: performing chemical cleaning by supplying a chemical to the front surface of the substrate, and then performing rinsing by supplying a rinsing liquid to that front surface of the substrate, while rotating the substrate.

7. The method of claim 6, wherein the treating liquid is the rinsing liquid.

8. The method of claim 1, wherein the first rotational speed is 500 rpm or less.

9. The method of claim 8, wherein the first rotational speed is 30 to 100 rpm, the second rotational speed is 10 to 30 rpm, and the rotational speed of the substrate for supplying the gas is 60 to 500 rpm.

10. The method of claim 1, wherein the rotational speed of the substrate linearly decreases from the first rotational speed until reaching the second rotational speed, the rotational speed of the substrate linearly continues to increase from the second rotational speed until gas supply is started, and the gas is supplied to the substrate while maintaining rotation of the substrate at that rotational speed.

11. The method of claim 1, wherein the gas is supplied using a nozzle having a slit discharge outlet.

12. The method of claim 11, wherein the nozzle is provided so as to discharge the gas radially towards outer sides of the substrate.

13. The method of claim 1, wherein the front surface of the substrate includes a hydrophobic area.

14. The method of claim 6, wherein a hydrofluoric acid chemical is used as the chemical.

15. The method of claim 1, wherein the gas is an inert gas.

16. A computer readable storage media in which a control program to be executed by a computer is stored, wherein, the control program, when executed, causes the computer to control a substrate cleaning apparatus to conduct a substrate cleaning method that comprises rotating a substrate at least for a period, performing liquid cleaning on a front surface of the substrate and drying the substrate, wherein said performing liquid cleaning on the front surface of the substrate comprises supplying a treating liquid with a liquid supply position set at a central portion of the substrate while rotating the substrate at a reference rotational speed, and said drying the substrate comprises:

then, supplying the treating liquid with the liquid supply position kept at the central portion of the substrate and, at a first time point, starting a speed-reducing operation of reducing a rotational speed of the substrate from the reference rotational speed;

then, from the first time point, continuing the speed-reducing operation along with supply of the treating liquid and, at a second time point thereafter when the rotational speed of the substrate thereby reaches a first rotational; speed lower than the reference rotational speed, starting a scanning operation of moving the liquid supply position from the central portion of the substrate towards a peripheral portion thereof while supplying the treating liquid;

then, from the second time point, further continuing the speed-reducing operation along with supply of the treating liquid and the scanning operation, and, at a third time point thereafter when the rotational speed of the substrate thereby reaches a second rotational speed lower than the first rotational speed, stopping supply of the treating liquid and ending the speed-reducing operation;

then, increasing the rotational speed of the substrate from the second rotational speed with supply of the treating liquid kept stopped from the third time point; and supplying a gas to the substrate while rotating the substrate at a higher rotational speed than the second rotational speed with supply of the treating liquid kept stopped from the third time point.

* * * * *